United States Patent [19]

Kraemer

[11] 3,757,238

[45] Sept. 4, 1973

[54] PARAMETRIC AMPLIFIER

[75] Inventor: Erich Henry Kraemer, Huntington, N.Y.

[73] Assignee: Cutler-Hammer, Inc., Milwaukee, Wis.

[22] Filed: July 31, 1972

[21] Appl. No.: 276,565

[52] U.S. Cl. .................................... 330/4.9, 330/56
[51] Int. Cl. ............................................ H03f 3/10
[58] Field of Search ..................................... 330/4.9

[56] References Cited

UNITED STATES PATENTS 3,105,941 12/1963 Kliphuis ............................ 330/4.9

*Primary Examiner*—John Kominski
*Assistant Examiner*—Darwin R. Hostetter
*Attorney*—Henry Huff

[57] ABSTRACT

A balanced parametric amplifier with waveguide signal and pump ports and varactor diodes parallel resonant at the idler frequency.

3 Claims, 2 Drawing Figures

PARAMETRIC AMPLIFIER

BACKGROUND

1. Field

The invention relates to parametric amplifiers of the type in which semiconductor diodes are operated as electrically variable capacitors. A high frequency pump voltage applied to the diodes causes them to exhibit negative resistance to signal energy of a lower frequency, producing reflection of the signal with amplification.

2. Prior Art

Prior art parametric amplifiers are illustrated by U.S. Pat. Nos. 3,105,941 to Kliphuis, 3,127,566 to Lombardo, and 3,443,233 to Kashkin et al.

Theoretical aspects of such amplifiers are discussed in Greene et al., Proceedings of the IRE, Sept. 1960, pages 1583–1590, and the Bell Telephone System Monograph 3784, published in 1961.

The foregoing references are the most pertinent prior art presently known to applicant. They describe various approaches to improving the bandwidth and noise characteristics of diode parametric amplifiers and maintaining the required isolations between the signal, pump and idler.

Ideally, the idler frequency should be as high as is practicable, and circuit losses at the idler frequency should be as low as possible. It follows that the diodes should be self resonant at the idler frequency, and that the idler should be isolated from the signal and pump circuits.

The Lombardo device operates with a diode series resonant at the idler frequency, pumped from a high impedance source through a quarter wavelength line. The diode and the end of the pump line connected to it act as very low impedances at the idler frequency, tending to isolate the idler from the relatively higher impedance signal circuit. This arrangement meets the desired conditions to some extent, but adds reactances that reduce the operating bandwidth, and restricts the idler frequency to the relatively low series self resonant frequency of the diode.

Kliphuis uses two diodes in a balanced configuration that tends to cancel the idler with respect to the signal circuit. The diodes are series resonant at the idler, as in Lombardo.

The Kashkin et al. device uses a single diode in parallel self resonance at the idler frequency, mounted in a radial line filter that confines the idler. This structure, like that of Kliphuis, requires a coaxial line signal port, with the accompanying problems, particularly at signal frequencies above about 15GHz, of high losses, overmoding, and stray reactances that reduce the gain — bandwidth product. Low loss coaxial circulators for frequencies above 15 GHz are not practicable at present; accordingly a waveguide to coax transition must be used, further reducing the bandwidth and raising the noise temperature.

SUMMARY

According to this invention two varactor diodes are mounted in symmetrical end to end opposed polarity relationship in the E plane of an enclosed cavity which is provided with signal and pump ports adapted to cooperate with rectangular waveguides operating in the usual $TE_{01}$ mode. The pump frequency is chosen with respect to the signal frequency so that the difference, or idler, frequency is at the diode parallel self-resonance. The idler frequency energy developed in each diode is decoupled from the waveguide by virtue of the high parallel-resonant impedance of the other diode. The idler voltages developed across the two diodes are 180° out of phase so that the net voltage across both diodes in series, and hence the waveguide, is zero. This assumes both diodes have closely matched electrical characteristics. The idler is therefore not loaded except by the diode internal resistance. The signal port can be coupled to a readily available type of waveguide circulator without a mode transition device.

DESCRIPTION OF THE PREFERRED EMBODIMENTS

Figure 1:
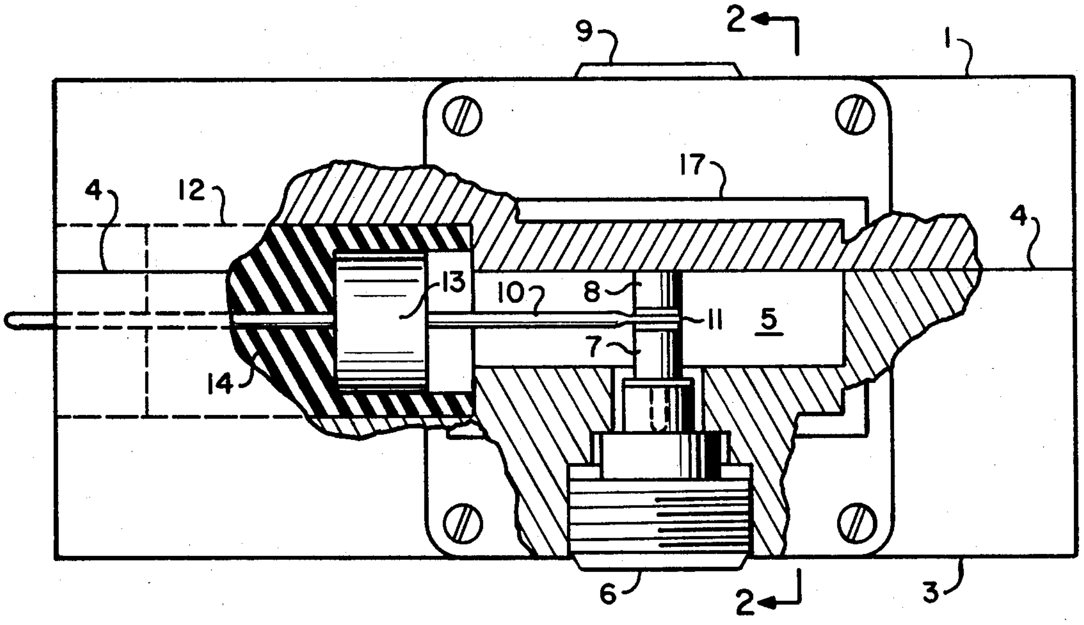
FIG. 1 is a view in elevation of a preferred embodiment of the invention, partly broken away to show internal details.

The main body of the structure of FIG. 1 may be fabricated by machining metal blocks 1 and 3 to form the required internal surfaces and openings, and joining their matching surfaces at the plane 4, thus defining a shallow cavity 5. A vertical hole in the lower block 3 is adapted to receive a plug 6 with a chuck or other suitable usual means for accepting the connector pin of a varactor diode 7 and mechanically supporting the diode with its upper contact flange near the center of the cavity 5. A similar arrangement, not shown in detail, is provided in the upper block 1 for supporting a varactor diode 8 by means of a plug 9.

The diode 8 is mounted in an inverted position with respect to diode 7. The diodes are selected to be as nearly identical in their electrical characteristics as is practicable. When mounted as shown, their polarities, i.e., directions of easy conduction, are opposed. The requisite d-c reverse bias may be applied to both diodes by way of a conductor 10 disposed midway between the upper and lower walls of the cavity 5 and terminating in a flattened end region 11 between and in engagement with the adjacent contact flanges of the diodes.

The bias conductor 10 extends out of the cavity 5 through a bore 12 formed in the assembled main body 1, 3 for connection to an external d-c source. An enlarged portion 13 on the conductor 10 cooperates with the adjacent surface of the bore to act as an r-f bypass capacitor. The conductor 10 and its enlarged portion 13 are supported within the bore 12 by a body 14 of insulating material. The position of the enlarged portion 13 on the conductor 10 is made such as to present a substantially open circuit high impedance to the varactors 7 and 8 at the idler frequency.

Figure 2:
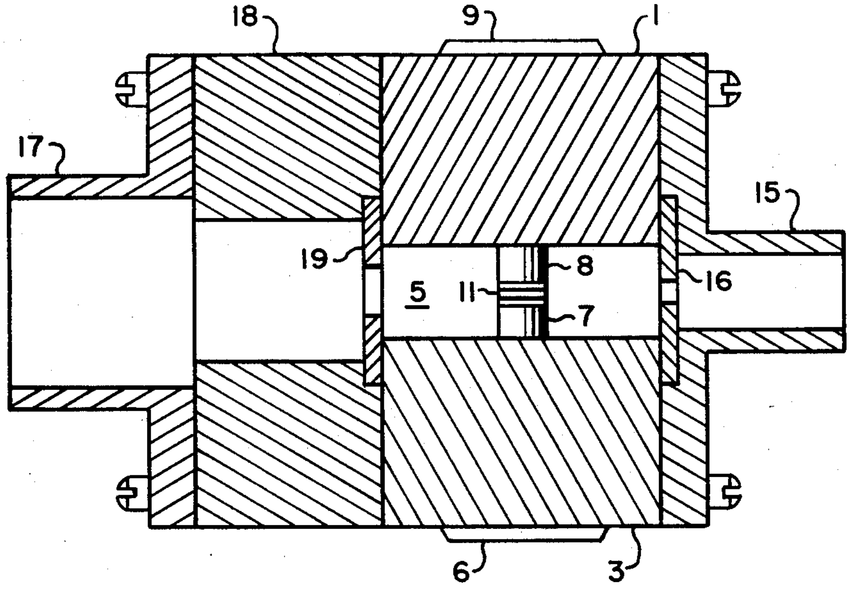
FIG. 2 is a cross section of the structure of FIG. 1 in the plane 2—2.

Referring to FIG. 2, a rectangular waveguide 15 secured to the right hand side of the main body 1,3 provides a pump input port to the cavity 5. The guide 15 is dimensioned to pass the relatively high pump frequency, say 50 GHz, and to be cut off at the relatively lower signal and idler frequencies. An iris 16, parallel resonant at the pump frequency, is disposed at the entrance to the cavity. The iris is transparent to the pump frequency and acts as a closed conductive wall at the idler and signal frequencies.

A second rectangular waveguide 17, dimensioned to pass at the signal frequency, is connected to the left hand side of the body 1,3 by way of a transformer section 18. The transformer is designed to provide the proper impedance transformation from the signal guide 17 to the relatively low impedance presented by the mounted diodes at the signal frequency. An iris 19, parallel resonant at the signal frequency, passes that frequency but acts as a conductive wall at the pump and idler frequencies.

Typical commercially available encapsulated varactor diodes, mounted as shown, exhibit parallel self resonance at about 32 GHz and series resonance at about 18 GHz. The series resonant frequency depends somewhat on the height of the cavity 5, increasing as the height is decreased. The series resonant frequency of the assembly of diodes, cavity and transformer section 18 is made the same as the desired signal operating frequency by design of the cavity and transformer, and may be adjusted if necessary by conventional tuning means, not shown.

The pump frequency is chosen to make the idler frequency coincide with the parallel self resonance of the varactor diodes. Assuming parallel self resonance at 32 GHz and signal frequency at 18GHz, the pump frequency is 50 GHz.

In operation, the signal to be amplified enters the cavity 5 from the signal guide 17 in the $TE_{01}$ mode, with the electric field directed vertically between the upper and lower walls. Pump power supplied by way of the pump guide 15 produces a similar $TE_{01}$ mode pump field. The fields induce pump and signal voltages in the same directions across both varactors, which exhibit negative resistance to the signal, and reflect amplified signal out through the signal guide.

The varactors also generate idler voltages, but in opposite polarities because the diodes are physically inverted with respect to each other. The resulting idler fields can exist essentially only in the varactors themselves, because their external resultant is a TEM mode field, with electric field vectors extending in opposite directions between the center and the respective upper and lower walls of the cavity. This mode cannot propagate in the cavity without an intermediate conductor, and does not propagate on the bias line 10 because that is terminated to present substantially open circuit impedance at the diode connection 11.

I claim:

1. A parametric amplifier, including a. means defining an enclosed cavity with electrically conductive upper and lower walls, b. means defining a signal port into said cavity adapted to cooperate with a hollow waveguide operating in the $TE_{01}$ mode, with a signal field in the cavity having its electric vector extending between and perpendicular to said upper and lower walls in the $TE_{01}$ mode, c. means for supporting a pair of varactor diodes, each parallel resonant at the idler frequency, in symmetrical end to end opposed polarity relationship in the E plane of said cavity between said upper and lower walls, and d. means for producing a pump field in said cavity in said $TE_{01}$ mode.

2. The invention set forth in claim 1, wherein said last mentioned means includes a pump port adapted to cooperate with a hollow waveguide that is beyond cutoff at the signal frequency.

3. The invention set forth in claim 1, including a d-c bias conductor extending parallel to and midway between said upper and lower walls for connection to the adjacent ends of a pair of varactor diodes mounted in said cavity, and means defining an r-f discontinuity at a point on said bias conductor which reflects an open circuit resonant impedance to said diodes at the idler frequency.

* * * * *